United States Patent
Pandey

(10) Patent No.: US 12,507,434 B2
(45) Date of Patent: Dec. 23, 2025

(54) METAL OXIDE SEMICONDUCTOR DEVICES AND METHODS OF MAKING THEREOF

(71) Applicant: GlobalFoundries U.S. Inc., Malta, NY (US)

(72) Inventor: Shesh Mani Pandey, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 489 days.

(21) Appl. No.: 18/064,285

(22) Filed: Dec. 12, 2022

(65) Prior Publication Data
US 2024/0194783 A1    Jun. 13, 2024

(51) Int. Cl.
| H01L 29/78 | (2006.01) |
| H10D 30/01 | (2025.01) |
| H10D 30/65 | (2025.01) |
| H10D 62/10 | (2025.01) |
| H10D 62/17 | (2025.01) |

(52) U.S. Cl.
CPC ....... H10D 30/657 (2025.01); H10D 30/0281 (2025.01); H10D 62/116 (2025.01); H10D 62/393 (2025.01)

(58) Field of Classification Search
None
See application file for complete search history.

(56) References Cited

U.S. PATENT DOCUMENTS 6,555,874 B1    4/2003  Hsu et al.
2016/0211367 A1*  7/2016  Ito ................. H10D 62/158

OTHER PUBLICATIONS

U.S. Appl. No. 18/046,531, Pandey.
Yan-Hui Zhang, A uniform doping ultra-thin SOI LDMOS with accumulation-mode extended gate and back-side etching technology, Chin. Phys. B, 2016, 027306-1 to 5, vol. 25, No. 2, Chinese Physical Society and IOP Publishing Ltd., China.
Dawei Xu, Multi-Gates SOI LDMOS for Improved on-state Performance, Proceedings of the 26th International Symposium on Power Semiconductor Devices & IC's, Jun. 15-19, 2014, 175-178, IEEE, U.S A.

* cited by examiner

Primary Examiner — William C Trapanese
(74) Attorney, Agent, or Firm — Francois Pagette

(57) ABSTRACT

A semiconductor device comprises a semiconductor layer over an insulator layer and a base layer under the insulator layer. A drain region comprises a well in the base layer, a doped region above and coupled with the well, a first drift region above and coupled with the first region, and a second drift region above the first doped region. The first doped region is at least partially in the insulator layer and the first drift region is at least partially in the semiconductor layer. A trench isolation structure is within the drain region and a gate stack is partially over the semiconductor layer and overlapping the first drift region.

20 Claims, 6 Drawing Sheets

METAL OXIDE SEMICONDUCTOR DEVICES AND METHODS OF MAKING THEREOF

FIELD OF THE INVENTION

The disclosed embodiments relate generally to metal oxide semiconductor (MOS) devices, and more particularly, to laterally diffused metal oxide semiconductor (LDMOS) devices with silicon on insulator (SOI) and methods of making such devices.

BACKGROUND

The prolific use of wireless communication products such as mobile phones and base stations have driven demand for high frequency devices, for example, laterally diffused metal oxide semiconductor (LDMOS) devices. The LDMOS devices may be used in radio frequency (900 MHz-2.4 GHz) circuits. Such devices with high operating bandwidth, high breakdown voltage, and high output power are suitable for use in power amplifier of wireless communication base station.

However, current LDMOS devices have a large area due to the laterally diffused drain leading to high cost and scaling challenges. Thereby, there is a need for an improved laterally diffused metal oxide semiconductor structure to overcome the challenges mentioned above.

SUMMARY

According to an embodiment of the invention, a semiconductor device comprises a semiconductor layer over an insulator layer and a base layer under the insulator layer. A drain region comprising a well in the base layer, a first doped region above and coupled with the well, a first drift region above and coupled with the first doped region, and a second drift region above the first doped region. The first doped region is at least partially in the insulator region, and the first drift region is at least partially in the semiconductor layer. A trench isolation structure is within the drain region and a gate stack is partially over the semiconductor layer and overlapping the first drift region.

According to another embodiment of the invention, a semiconductor device comprises a semiconductor layer over an insulator layer and a base layer under the insulator layer. A drain region comprises a well in the base layer, a first doped region above and coupled with the well, a first drift region above and coupled with the first doped region, and a second drift region above the first doped region. The first doped region is in the insulator region, and the first drift region is at least partially in the semiconductor layer. A trench isolation structure is within the drain region and a gate stack has a first portion over the semiconductor layer, a second portion over the first drift region, and a third portion over the trench isolation structure, wherein the second portion is adjacent to and between the first portion and the third portion.

According to yet another embodiment of the invention, a method of fabricating a semiconductor device comprises forming a drain region in a substrate, where the substrate comprises a semiconductor layer over an insulator layer and a base layer under the insulator layer. The forming of the drain region further comprises forming an opening in the substrate and the opening terminates at the base layer. The method further comprises forming of a well in the base layer under the opening, forming a doped region over the well and within the opening, where the doped region is at least partially in the insulator region. The method further comprises forming of a drift region over the doped region, where the drift region is at least partially in the semiconductor layer. The method further comprises forming of a trench isolation structure in the drain region, and a gate stack partially over the semiconductor layer and partially over drift region.

BRIEF DESCRIPTION OF THE DRAWINGS

The disclosed embodiments will be better understood from a reading of the following detailed description, taken in conjunction with the accompanying drawings.

Figure 1A:
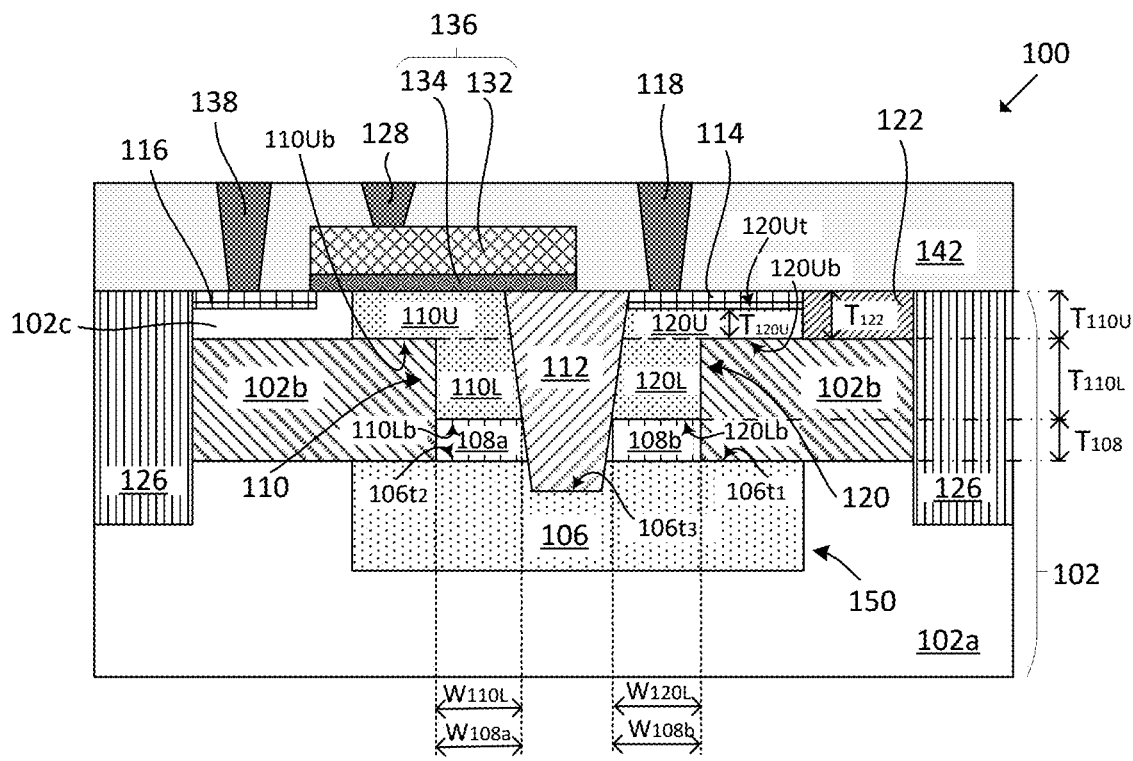
FIG. 1A shows a simplified cross-sectional view of a LDMOS device 100, according to an exemplary embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A shows an LDMOS device 100, according to an embodiment of the disclosure. The LDMOS device 100 may include a substrate 102 having a base layer 102a, a semiconductor layer 102c above the base layer 102a and an insulator layer 102b between the base layer 102a and the semiconductor layer 102c. In an embodiment, the substrate 102 may be a silicon on insulator (SOI) substrate. The base layer 102a, and semiconductor layer 102c may include a doped silicon, for example, p-type doped silicon, while the insulator layer 102b may include a buried oxide (BOX)

layer, such as silicon dioxide. The LDMOS device 100 may include a source contact region 116 coupled with a source contact 138, a drain contact region 114 coupled with a drain contact 118, and a gate stack 136 coupled with a gate contact 128. The LDMOS device 100 may further include a drain region 150 in the substrate 102, arranged partially under the gate stack 136 and coupled with the drain contact region 114. The drain region 150 may include a drift region 110 over a doped region 108a, another drift region 120 over another doped region 108b and a well 106 below the doped regions 108a and 108b. Drift region 120 may be spaced from drift region 110. In an embodiment, the drift region 110 directly contacts the doped region 108a, and the drift region 120 directly contacts the doped region 108b. In another embodiment, the doped regions 108a and 108b directly contacts the well 106. The doped regions 108a and 108b may be arranged in the insulator layer 102b and be in direct contact with the well 106, while the well 106 may be arranged in the base layer 102a. The LDMOS device 100 may further include a trench isolation structure 112 within the drain region 150 and an isolation structure 122 adjacent to the drain region 150. In some embodiments, the trench isolation structure 112 may space at least a portion of drift region 110 from drift region 120. In other embodiments, the trench isolation structure 112 may space the drain contact region 114 from at least a portion of drift region 110. The isolation structure 122 may be above the insulator layer 102b and have a top surface coplanar or substantially coplanar with the top surface of drain region 150. Shallow trench isolation (STI) structures 126 may be arranged in the substrate 102, for example, next to source contact region 116 and drain contact region 114 of the LDMOS device 100, providing electrical isolation from adjacent devices. The STI structures 126 may be adjacent to and directly contact side surfaces of the semiconductor layer 102c. In some embodiments, the STI structures 126 may extend vertically downwards to directly contact the insulator layer 102b. In other embodiments, the STI structures 126 may directly contact the base layer 102a.

The drift regions 110 and 120 may be at least partially positioned in the semiconductor layer 102c. In an embodiment, drift regions 110 and 120 may extend into at least a portion of the insulator layer 102b. For example, the drift region 110 may have an upper portion 110U that is within the semiconductor layer 102c and a lower portion 110L that is within the insulator layer 102b. Similarly, the drift region 120 may also have an upper portion 120U within the semiconductor layer 102c and a lower portion 110L within the insulator layer 102b. In some embodiments, drift region 120 may be spaced from at least the upper portion 110U of drift region 110. For example, the trench isolation structure 112 may at least space the drift region 120 from the upper portion 110U of the drift region 110. In an embodiment, the upper portion 110U is integrally joined to the lower portion 110L and the upper portion 120U is integrally joined to the lower portion 120L. As an example, the upper portion 110U and the lower portion 110L may share a common interface, and the upper portion 120U and lower portion 120L may also share a common interface, where the interfaces are depicted by dotted lines as shown in FIG. 1A as an example. In an embodiment, the top surface of the drift region 110 may be coplanar or substantially coplanar with the top surface of the trench isolation structure 112. In another embodiment, the top surface of the drift region 110 may be coplanar or substantially coplanar with the top surface of the semiconductor layer 102c. In yet another embodiment, the top surface of the drift region 110 may be coplanar or substantially coplanar with the top surface of the isolation structure 122. The upper portion 110U of the drift region 110 may partially overlap the insulator layer 102b, for example, upper portion 110U may comprise a bottom surface 110Ub directly contacting a portion of the top surface of the insulator layer 102b. The lower portion 110L of the drift region 110 may have a bottom surface 110Lb in direct contact with the doped region 108a. In another embodiment, the upper portion 120U of the drift region 120 may partially overlap the insulator layer 102b, for example, upper portion 120U may comprise a bottom surface 120Ub directly contacting another portion of the top surface of the insulator layer 102b. The lower portion 120L of the drift region 120 may have a bottom surface 120Lb in direct contact with the doped region 108b. In an embodiment, the bottom surface 110Ub of the upper portion 110U may be coplanar or substantially coplanar with the bottom surface 120Ub of the upper portion 120U. In an embodiment, the bottom surface 110Lb may be coplanar or substantially coplanar with the bottom surface 120Lb.

The lower portion of the drift region 110 has a width $W_{110L}$ that may be taken along the bottom surface 110Lb of the lower portion 110L, from a side surface in contact with the insulator layer 102b to an opposite side surface that is in contact with the trench isolation structure 112. In an embodiment, the width $W_{110L}$ may be substantially the same as that of the width $W_{108a}$ of the top surface of the doped region 108a. The width $W_{108a}$ of the top surface of the doped region 108a may be measured from a side surface in contact with the insulator layer 102b to an opposite side surface that is in contact with the trench isolation structure 112. For example, the width $W_{110L}$ may be equal to the width $W_{108a}$ of the top surface of the doped region 108a.

Similarly, the lower portion of the drift region 120 has a width $W_{120L}$ that may be taken along the bottom surface 120Lb of the lower portion 120L, from a side surface in contact with the insulator layer 102b to an opposite side surface that is in contact with the trench isolation structure 112. In an embodiment, the width $W_{120L}$ may be substantially the same as that of the width $W_{108b}$ of the top surface of the doped region 108b. The width $W_{108b}$ of the top surface of the doped region 108b may be measured from a side surface in contact with the insulator layer 102b to an opposite side surface that is in contact with the trench isolation structure 112. For example, the width $W_{120L}$ may be equal to the width $W_{108b}$ of the top surface of the doped region 108b.

The upper portion 110U of the drift region 110 has a thickness $T_{110U}$ measured from the top surface that is coplanar or substantially coplanar with the top surface of the isolation structure 122, to the interface adjoining the upper portion 110U and lower portion 110L, while the lower portion 110L has a thickness $T_{110L}$ measured from the aforementioned interface to the bottom surface 110Lb that is in contact with the doped region 108a. On the other hand, the upper portion 120U of the drift region 120 has a thickness $T_{120U}$ measured from the top surface 120Ut in contact with drain contact region 114, to the interface adjoining the upper portion 120U and lower portion 120L, while the lower portion 120L has a thickness $T_{120L}$ measured from the aforementioned interface to the bottom surface 120Lb that is in contact with the doped region 108b. The thickness of the drift region 110 may be comprised of the thickness $T_{110U}$ of the upper portion 110U and the thickness $T_{110L}$ of the lower portion 110L. For example, the sum of thicknesses $T_{110U}$ and $T_{110L}$ equals to the thickness of the drift region 110. Similarly, the thickness of the drift region 120 may be comprised of the thickness $T_{120U}$ of the upper portion 120U and the thickness $T_{120L}$ of the lower portion 120L. In an embodiment, the thickness of drift region 110 may be greater than the thickness of drift region 120. In some embodiments, the thickness $T_{110U}$ of the upper portion 110U may be substantially the same as the thickness $T_{122}$ of the isolation structure 122. For example, the thickness $T_{110U}$ of the upper portion may be equal to $T_{122}$ of the isolation structure 122. In another embodiment, the thickness $T_{110L}$ of the lower portion 110L may be lesser than the thickness of the insulator layer 102b.

The doped regions 108a and 108b may be arranged in the insulator layer 102b, for example, the doped regions 108 may each have a sidewall that is in direct contact with the insulator layer 102b. The doped region may also each have a sidewall that is in direct contact with the trench isolation structure 112. As may be appreciated from the process descriptions provided later, the doped regions 108a and 108b may be formed in the same process steps and thus have substantially the same thickness. For example, the doped regions 108a and 108b may each have thicknesses equal to $T_{108}$. As may be appreciated, manufacturing variations may result in slight differences between the thicknesses. In some embodiments, the thickness of the insulator layer may be comprised of the thickness $T_{108}$ of doped region 108a and the thickness $T_{110L}$ of the lower portion 110L of drift region 110, or the thickness $T_{108}$ of doped region 108b and the thickness $T_{120L}$ of the lower portion 120L of drift region 120. For example, the thickness of the insulator layer may be equal to the sum of the thicknesses of doped region 108a and lower portion 110L of drift region 110, or the thickness of the insulator layer may be equal to the sum of the thicknesses of the doped region 108b and lower portion 120L of drift region 120.

The well 106 may be in the base layer 102a and have a top surface portion $106t_1$ that directly contacts the bottom surface of the insulator layer 102b, another top surface portion $106t_2$ that directly contacts the bottom surface of the doped regions 108a and 108b, and another top surface portion $106t_3$ that directly contacts the bottom surface of the trench isolation structure 112. In some embodiments, the top surface portion 106t1 is coplanar or substantially coplanar with the top surface of the base layer 102a. In another embodiment, top surface portions $106t_1$ and $106t_2$ are coplanar or substantially coplanar. In yet another embodiment, the trench isolation structure 112 extends into the well 106, such that the top surface portion $106t_3$ of the well 106 is lower than the top surface portions $106t_1$ and $106t_2$.

The drift regions 110 and 120, the doped regions 108a and 108b, and the well 106 may have the same polarity in an embodiment. For example, the drift regions 110 and 120, well 106 and doped regions 108a and 108b may be doped with an n-type dopant. In an embodiment, drift regions 110 and 120 may have a different doping concentration from the well 106, and the well 106 may have a different doping concentration from the doped regions 108a and 108b. For example, the drift regions 110 and 120 may have a lower doping concentration than the well 106 and the well 106 may have a lower doping concentration compared to the doped regions 108a and 108b. As an example, the drift region 110 may have a dopant concentration range of $1\times10^{17}$ to $1\times10^{19}$ $cm^{-3}$. The well 106 may have a dopant concentration range of $5\times10^{16}$ to $1\times10^{19}$ $cm^{-3}$. The doped region 108 may have a dopant concentration range of $1\times10^{17}$ to $1\times10^{21}$ $cm^{-3}$.

The trench isolation structure 112 may provide electrical isolation between adjacent regions. In an embodiment, the drift region 110 is spaced from and electrically isolated from the drift region 120 by the trench isolation structure 112. In an embodiment, the doped region 108a is spaced from and electrically isolated from the doped region 108b. The trench isolation structure 112 may be arranged to partially underlap the gate stack 136 such that the top surface of trench isolation structure 112 is partially covered by and in direct contact with the bottom surface of gate stack 136. In some embodiments, the trench isolation structure 112 has a top surface coplanar or substantially coplanar with the top surface of the semiconductor layer 102c and the top surface of the drift region 110.

In some embodiments, an isolation structure 122 may be arranged between the drift region 120 and the STI structure 126, directly above and in contact with a portion of the insulator layer 102b. The isolation structure 122 may have a side surface in direct contact with the drain contact region 114 and an opposite side surface in direct contact with the STI structure 126. In an embodiment, the bottom surface of the isolation structure 122 may be fully in contact with a portion of the top surface of the insulator layer 102b. In an embodiment, the isolation structure 122 may have a thickness $T_{122}$ that is substantially the same as or equal to the thickness of the semiconductor layer 102c. In yet another embodiment, the isolation structure 122 may have a bottom surface that is at the same depth as the bottom surface of the semiconductor layer 102c. In other embodiments, the top surface of the isolation structure 122 may be coplanar or substantially coplanar with the top surface of the drift region 120. In other embodiments (not shown), the isolation structure 122 may be omitted such that the drain contact region 114 extends from a side surface of 112 to a side surface of the STI structure 126.

The LDMOS device 100 may further include a gate stack 136 including a gate 132 over a gate dielectric layer 134. The gate stack 136 may be arranged above the semiconductor layer 102c, with a first portion over the semiconductor layer 102c, a second portion over the drift region, and a third portion over the trench isolation structure. In some embodiments, the gate stack may overlap the drift region 110 and at least partially overlap the trench isolation structure 112. In other embodiments, the gate stack 136 may overlap at least half of the width of the top surface of the trench isolation structure 112. For example, the gate 132 may overlap and extend beyond half of the width of the top surface of the trench isolation structure 112. In another embodiment, the gate stack 136 may overlap the trench isolation structure 112 such that the top surface of the trench isolation structure 112 is under the gate stack 136. A gate contact 128 may be coupled with the gate 132. For example, the gate contact 128 may directly contact the top of the gate 132. The gate dielectric layer 134 may be arranged between the gate 132 and a portion of the semiconductor layer 102c. The gate dielectric layer 134 may also overlie the top surface of the drift region 110. In some embodiments, the gate dielectric layer 134 may directly contact the top surface of the drift region 110 and the top surface of the semiconductor layer 102c. In some embodiments, the top surface of the drift region 110 may be coplanar or substantially coplanar with the top surface of the semiconductor layer 102c. Source contact region 116 may be arranged in the semiconductor layer 102c and may be laterally spaced from the drift region 110. The source contact region 116 may partially underlap the gate dielectric layer 134 in some embodiments. A source contact 138 may be coupled with the source contact region 116. A portion of the semiconductor layer 102c may be below the source contact region 116 such that the source contact region 116 does not extend vertically downwards to contact the insulator layer 102b.

Figure 1B:
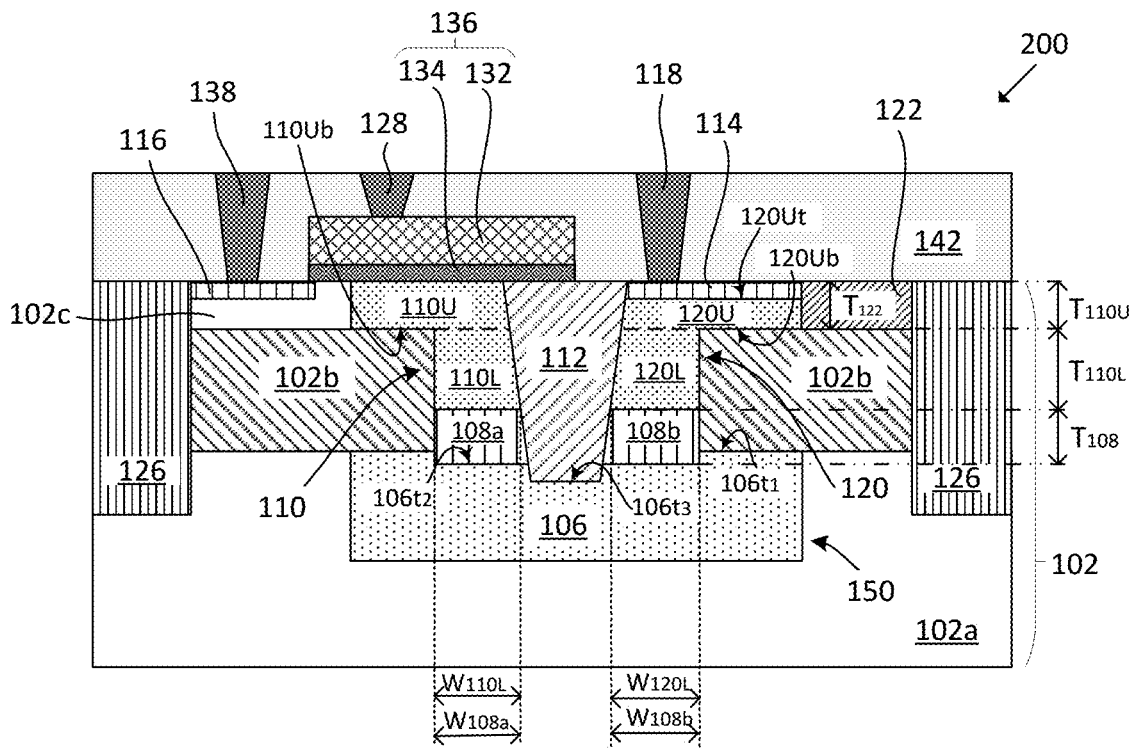
FIG. 1B shows a simplified cross-sectional view of a LDMOS device 200, according to an alternative exemplary embodiment of the disclosure.
Figure 1C:
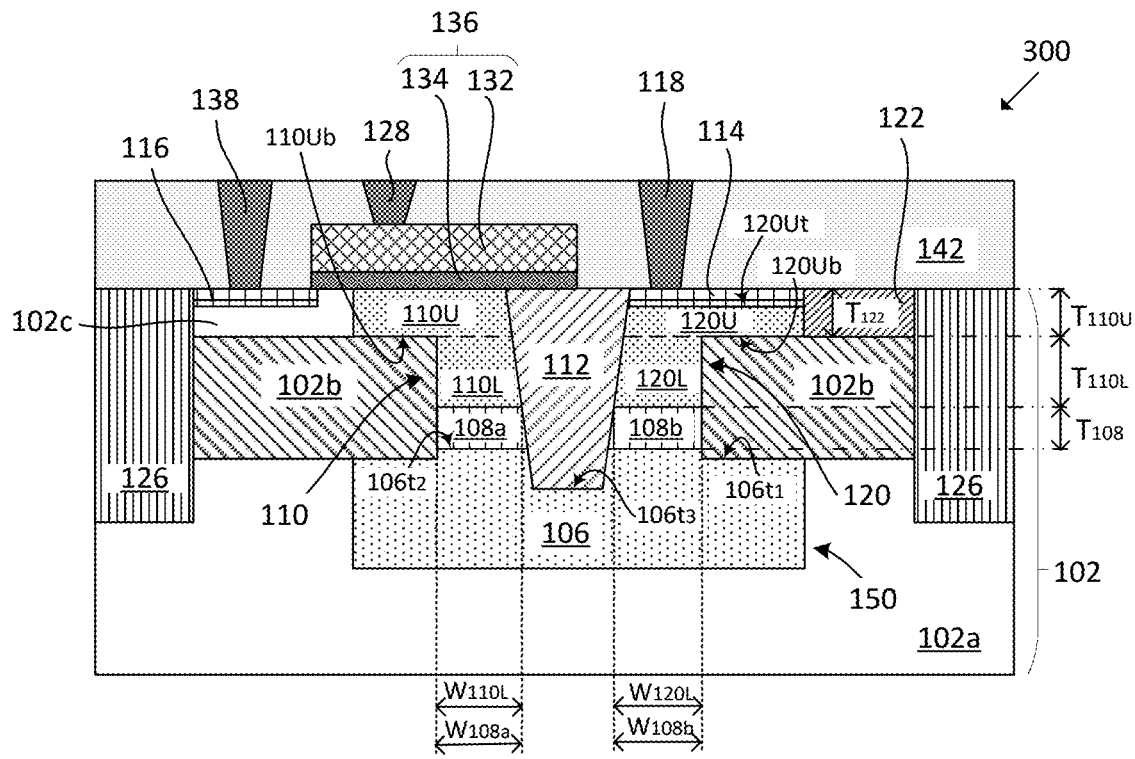
FIG. 1C shows a simplified cross-sectional view of a LDMOS device 300, according to another alternative exemplary embodiment of the disclosure.

The embodiment shown in FIG. 1A may be modified to form alternative embodiments without departing from the scope of the disclosure. For example, in accordance with an alternative embodiment of the disclosure, FIG. 1B shows a LDMOS device 200 in which like reference numerals refer to like features in FIG. 1A. LDMOS device 200 has a well 106 having a top surface portion $106t_2$ being lower than the adjacent top surface portion $106t_1$, where the top surface portion $106t_2$ is in direct contact with the bottom surface of doped regions 108a and 108b and the top surface portion $106t_1$ is in direct contact with the bottom surface of the insulator layer 102b. In another example, in accordance with another alternative embodiment of the disclosure, FIG. 1C shows LDMOS device 300 in which like reference numerals refer to like features in FIG. 1A. LDMOS device 300 has a well 106 having a top surface portion $106t_2$ being higher than the adjacent top surface portion $106t_2$, where the top surface portion $106t_2$ is in direct contact with the bottom surface of doped regions 108a and 108b and the top surface portion $106t_1$ is in direct contact with the bottom surface of the insulator layer 102b.

Figure 2:
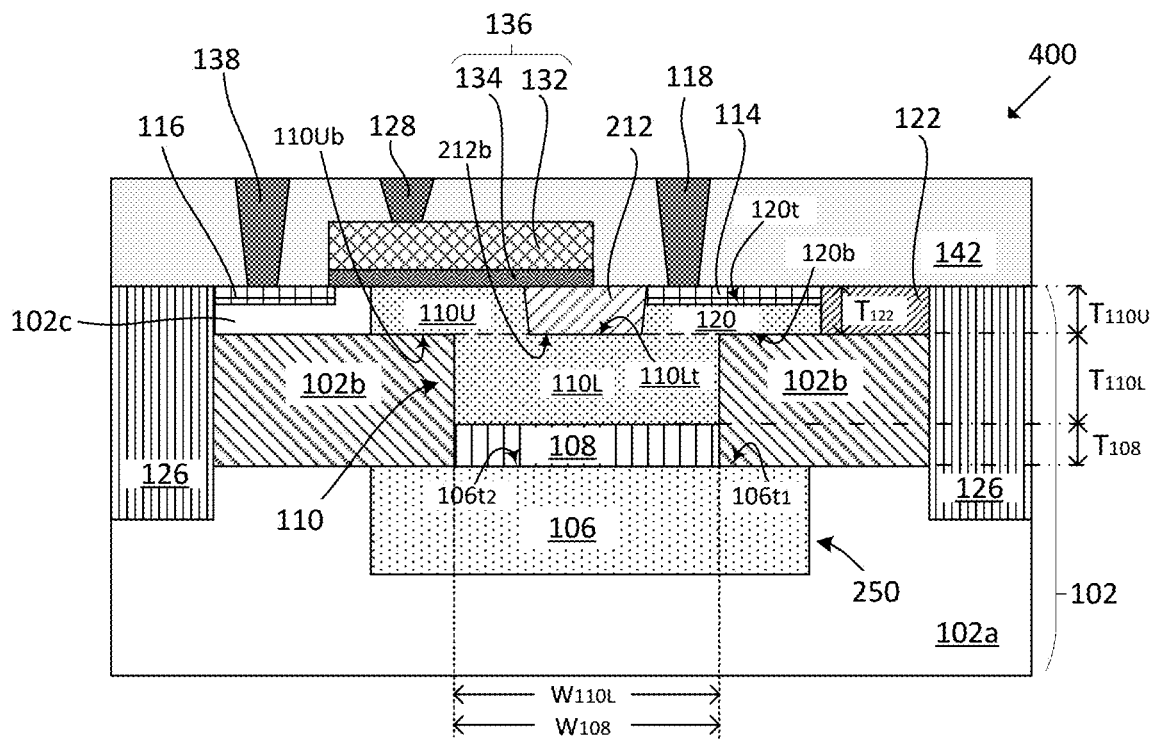
FIG. 2 shows a simplified cross-sectional view of a LDMOS device 400, according to yet another alternative exemplary embodiment of the disclosure.

FIG. 2 shows a LDMOS device 400, according to another embodiment of the disclosure. Like numerals in FIG. 2 may denote like features in FIG. 1A. LDMOS device 400 may have a drain region 250 that includes a drift region 110 over a doped region 108, another drift region 120 coupled with drift region 110, and a well 106 below the doped region 108. Drift regions 110 and 120 may at least be partially positioned in the semiconductor layer 102c. Drift region 110 has an upper portion 110U integrally joined to a lower portion 110L, and drift region 120 is integrally joined to the lower portion 110L of drift region 110. For example, the upper portion 110U and the lower portion 110L may share a common interface, and the drift region 120 and the lower portion 110L may share a common interface, where the interfaces are depicted by dotted lines in FIG. 2. The drift region 110 may have a bottom surface in direct contact with a doped region 108. For example, the lower portion 110L of the drift region may have a bottom surface in direct contact with the top surface of doped region 108. In an embodiment, the lower portion 110L may substantially have the same width as that of the doped region 108. For example, the width $W_{110L}$ of the lower portion 110L of the drift region 110 may be equal to the width $W_{108}$ of the doped region 108.

Still referring to FIG. 2, LDMOS device 400 may further include a trench isolation structure 212 within the drain region 250, where the trench isolation structure 212 has a depth that is at least the thickness of the semiconductor layer 102C. For example, the trench isolation structure 212 extends from a top surface of the substrate 102 to a depth where the insulator layer 102b begins, for example the depth of the top surface of the insulator layer 102b. In an embodiment, the top surface of the drift region 110 may be coplanar or substantially coplanar with the top surface of the trench isolation structure 212. In another embodiment, the top surface of the drain contact region 114 may be coplanar or substantially coplanar with the top surface of the trench isolation structure 212. The trench isolation structure 212 may have a bottom surface 212b directly contacting a top surface 110Lt of the lower portion 110L of drift region 110. In some embodiments, the bottom surface 212b of the trench isolation structure 212 may extend deeper than the top surface of insulator layer 102b.

Figure 3A:
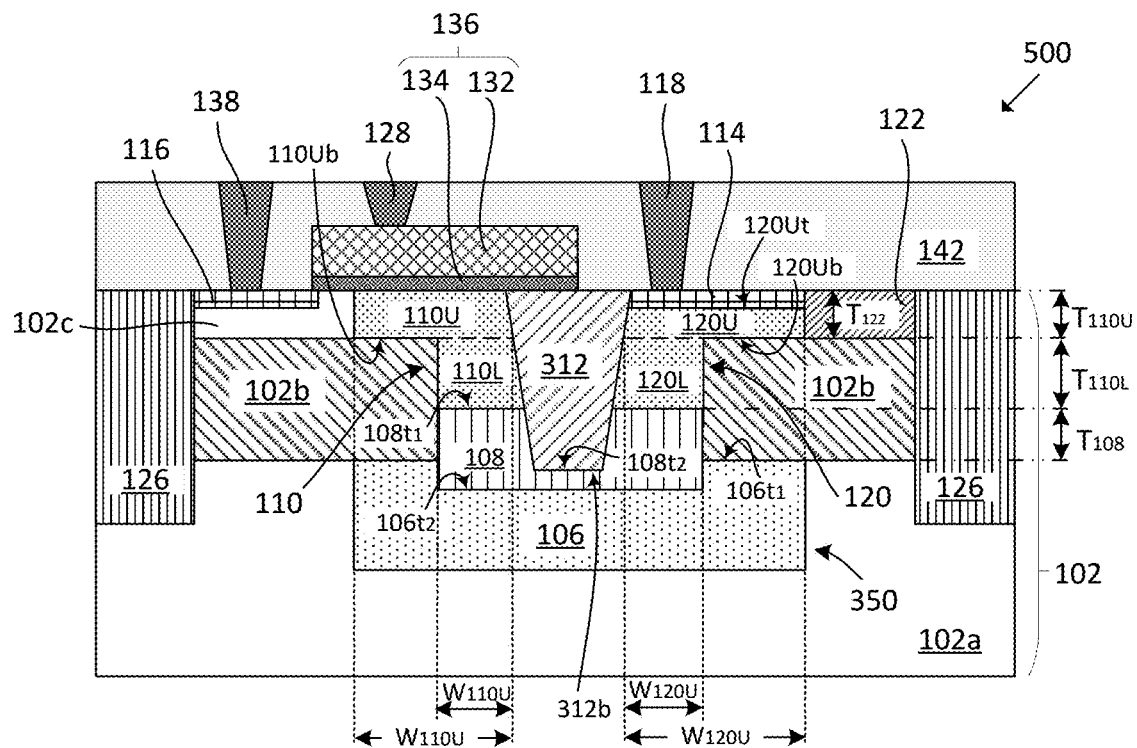
FIG. 3A shows a simplified cross-sectional view of a LDMOS device 500, according to yet another alternative exemplary embodiment of the disclosure.

FIG. 3A shows a LDMOS device 500, according to another embodiment of the disclosure. Like numerals in FIG. 3 may denote like features of LDMOS device 200 in FIG. 1B. LDMOS device 500 may have a drain region 350 that includes a drift region 110 over a doped region 108, another drift region 120 over the doped region 108, and a well 106 below the doped region 108. Drift regions 110 and 120 are similar to the drift regions of FIGS. 1A to 1C and will not be further elaborated upon. Like LDMOS device 200, the well 106 of LDMOS device 500 has a top surface portion $106t_2$ being lower than the adjacent top surface portion $106t_1$ that is in direct contact with the bottom surface of the insulator layer 102b, except that the top surface portion $106t_2$ is in direct contact with the bottom surface of a single doped region 108 instead of two doped regions 108a and 108b.

Still referring to FIG. 3A, LDMOS device 500 may further include a trench isolation structure 312 within the drain region 350, where the trench isolation structure 312 terminates within the doped region 108 instead of the well 106 as for LDMOS device 200. As a result, doped region 108 has at least two top surfaces adjacent to each other, for example a top surface $108t_1$ directly contacting the bottom surface 312b of the trench isolation structure 312, and a top surface $108t_2$ adjacent to the top surface $108t_1$, where the top surface $108t_1$ directly contacts the bottom surface of at least drift region 110. In an embodiment, the top surface $108t_1$ directly contacts the bottom surface of drift region 120 as well. In an embodiment, the trench isolation structure 312 extends from a top surface of the substrate 102 to a depth below the top surface $108t_1$ of the doped region 108 but above the top surface portion $106t_2$ of the well 106. The top surface of the trench isolation structure 312 may be coplanar or substantially coplanar with the top surface of the drift region 110 and the top surface of the drain contact region 114.

Figure 3B:
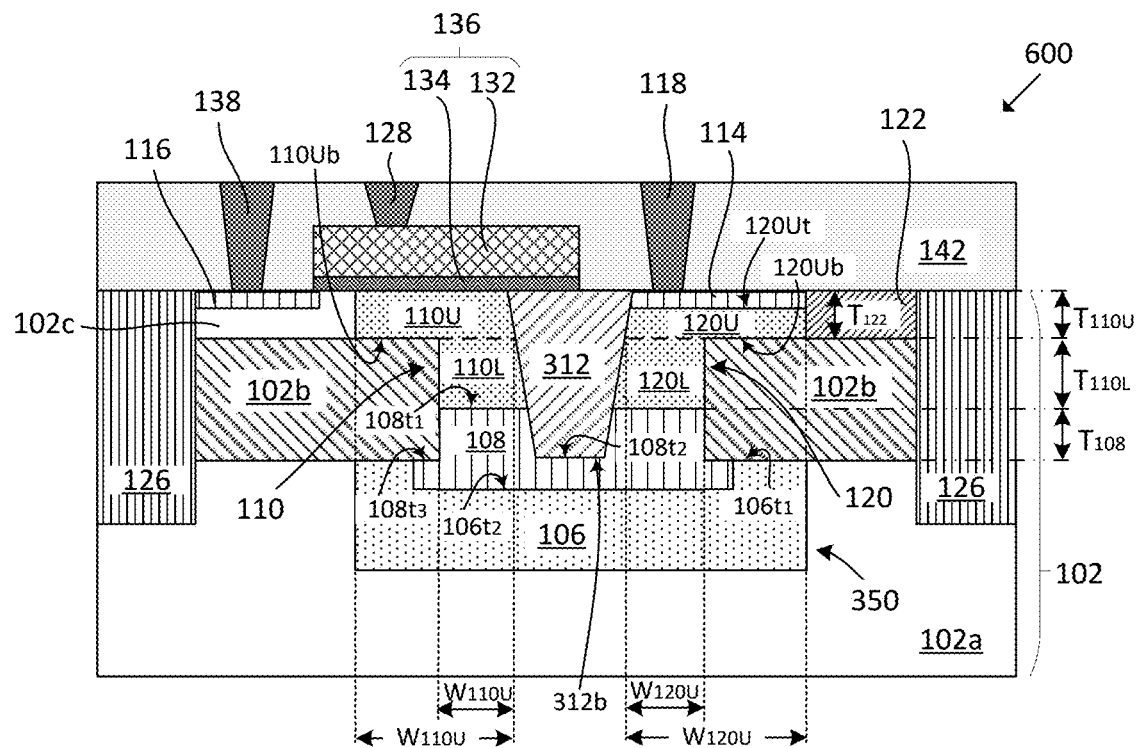
FIG. 3B shows a simplified cross-sectional view of a LDMOS device 600, according to yet another exemplary alternative embodiment of the disclosure.

FIG. 3B shows LDMOS device 600, according to yet another embodiment of the disclosure. Like numerals in FIG. 3B may denote like features of LDMOS device 500 in FIG. 3A. LDMOS device 600 includes a doped region 108 having a portion that partially extends under the edges of the insulator layer 102b. The portion of the doped region 108 extending under the edges of the insulator layer 102b has a top surface $108t_3$ which is in direct contact with the bottom surface of the insulator layer 102b. In an embodiment, the top surface $108t_1$ is higher than the top surface $108t_3$ of the doped region.

Figure 4A:
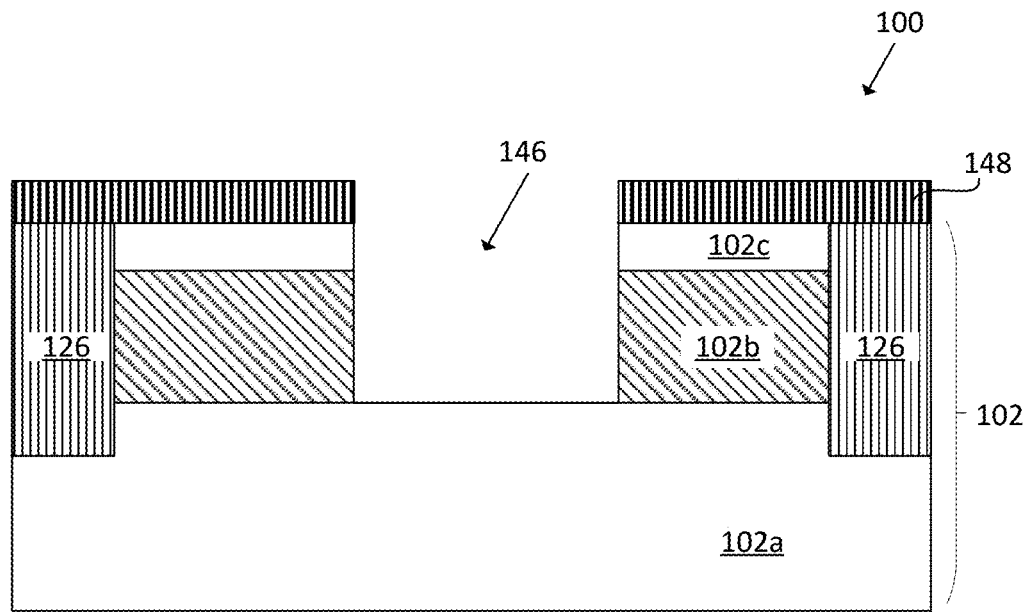
FIGS. 4A to 4F show simplified cross-sectional views representing an exemplary fabrication process flow for the LDMOS device shown in FIG. 1A, according to an exemplary embodiment of the disclosure.

FIGS. 4A to 4F show a fabrication process flow for the LDMOS device 100 shown in FIG. 1A, according to some embodiments of the disclosure. FIG. 4A shows the LDMOS device 100 at an exemplary processing step, for example, after the formation of shallow trench isolation (STI) structures 126 and an opening 146 in the substrate 102, according to an embodiment of the disclosure. The formation of the STI structures 126 may include forming openings in the substrate 102 by a material removal process. For example, a layer of photoresist may be deposited over the substrate 102, exposed and developed to form suitable photoresist patterns. A wet etch or dry etch process may be used to form openings in the substrate 102 by removing selected portions of the substrate 102, for example, regions of the substrate 102 that are not covered by the photoresist patterns. The photoresist patterns may subsequently be removed at this step or a later step. A layer of a suitable dielectric, for example, silicon dioxide, may be deposited in the openings. A suitable material process, for example, chemical mechanical planarization (CMP) may be used to remove unwanted portions of the dielectric layer, for example, over the top surface of the semiconductor layer 102c, so as to leave behind a portion of the dielectric layer in the openings to form the STIs.

To form the opening 146, a mask layer 148 may first be formed by depositing and patterning a layer of a suitable mask material, for example, silicon nitride, over the top surface of the semiconductor layer 102c. A suitable material removal process or processes may then be applied to remove portions of the semiconductor layer 102c and the insulator layer 102b which are not covered by the mask layer 148, thereafter forming opening 146. In some embodiments, opening 146 may terminate at the top surface of the base layer 102a, exposing a portion of the base layer 102a. In some embodiments, the opening 146 may extend into base layer 102a and in other embodiments, the opening 146 may extend partially under the edges of the insulator layer 102b. The material removal process may be a single step or multiple step process, including for example, a wet etch or dry etch process.

Figure 4B:
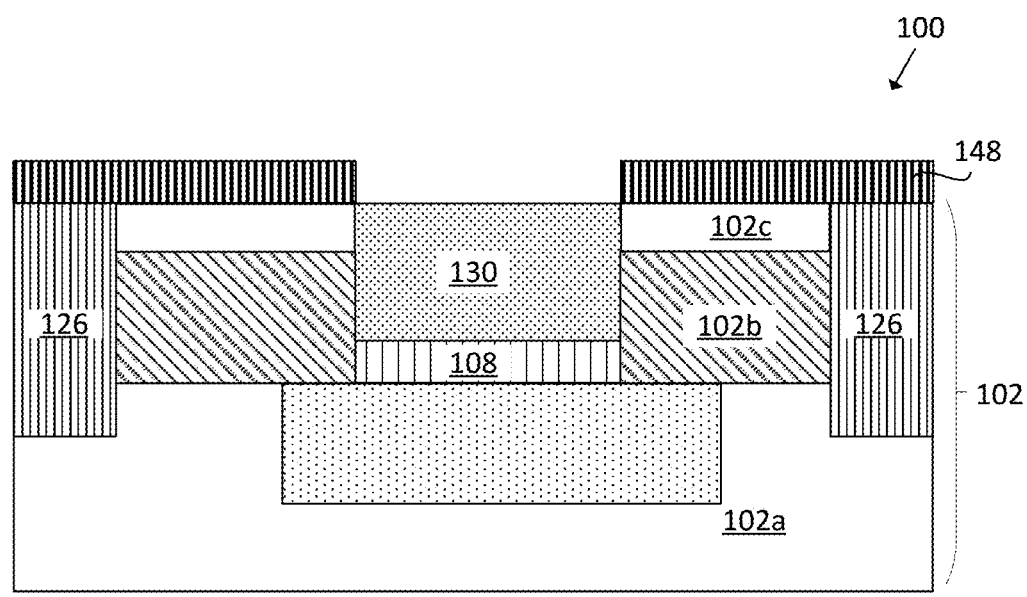

Referring now to FIG. 4B, which shows the LDMOS device 100 at a subsequent processing step, a well 106 is formed in the base layer 102a and a doped region 108 is formed over the well 106. The formation of the well 106 may include doping a portion of the base layer 102a below the opening 146. The doping process may include implantation of a suitable n-type dopant, for example, arsenic, phosphorus, or any other suitable n-type dopants followed by annealing. The doped region 108 may be formed by epitaxial growth of a layer of a suitable semiconductor, for example, silicon or any other suitable semiconductor. For embodiments where the opening 146 extends into base layer 102a during the forming of the opening 146, the doped region 108 may be formed to extend into the well 106, for example, as shown in FIG. 3A. In other embodiments where the opening 146 extends partially under the edges of the insulator layer 102b, the doped region 108 may be formed to extend into the well 106 and partially under the edges of the insulator layer 102b, for example, as shown in FIG. 3B.

Still referring to FIG. 4B, the LDMOS device 100 is shown after the formation of a doped region 108 in the opening 146 and a drift region 130 over the doped region 108, according to an embodiment of the disclosure. To form the doped region 108, an epitaxial structure may first be formed in the opening 146 by epitaxial growth of a layer of suitable semiconductor material, for example, silicon or any other suitable semiconductor. The semiconductor layer may be grown over the well 106 within the opening 146, partially filling up the opening 146. In an embodiment, the semiconductor layer may be in-situ doped by a suitable n-type dopant, for example, arsenic, phosphorus, or any other suitable n-type dopants. To form the drift region 130 over the doped region 108, another epitaxial structure may be grown over the top surface of the doped region 108, thereby filling up the opening 146, such that the top surface of the epitaxial structure is at least the same height as the top surface of the semiconductor layer 102c. The epitaxial structure on top of the doped region 108 may also be in-situ doped by a suitable n-type dopant, for example, arsenic, phosphorus, or any other suitable n-type dopants, so as to form drift region 130. The semiconductor materials used for growing the doped region 108 and the drift region 110 may be the same in some embodiments but may also be different in other embodiments.

Figure 4C:
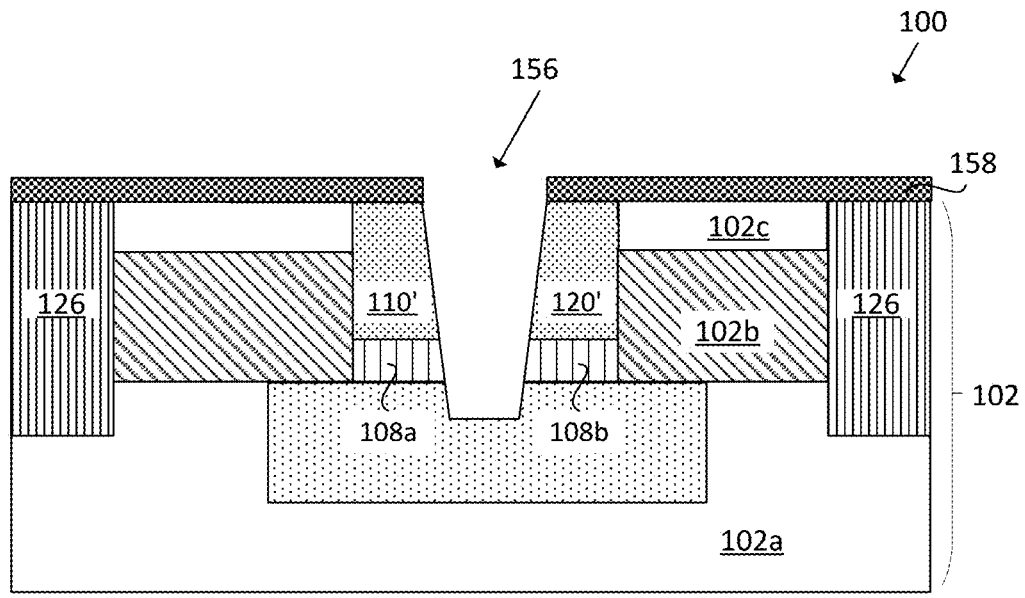

FIG. 4C shows the LDMOS device 100 at a subsequent processing step. Mask layer 148 may be removed by a suitable material removal process, for example an etch process, including a wet etching process using hot phosphoric acid, or a planarizing process, including a chemical mechanical planarizing (CMP) process. Another mask layer 158 may be formed over the top surfaces of drift region 130, the semiconductor layer 102c and STI structures 126. The mask layer 158 may be patterned to include an opening over the drift region 130, partially exposing a portion of the top surface of the drift region 130. Using a suitable material removal process, an opening 156 may be formed in at least the drift region 130. In some embodiments, the opening 156 may extend through the drift region 130 and the doped region 108 to terminate in the base layer 102a. In other embodiments, the opening 156 may not reach the base layer 102a and may terminate in the drift region 130 or the doped region 108. The depth of the opening 156 may be changed by adjusting the process parameters, such as duration and or chemistry of the material removal process. Depending on the depth of the opening 156, the drift region 130 may be split into separate drift regions 110' and 120' in some embodiments. In embodiments where the opening 156 terminates in the well region 106, the doped region 108 may also be split into separate doped regions 108a and 108b.

Figure 4D:
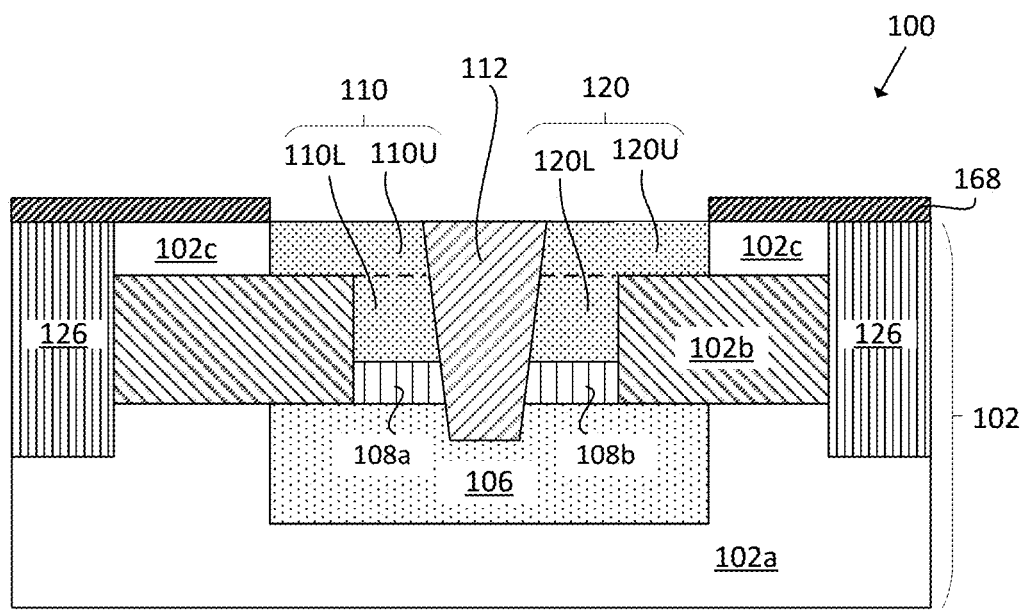

Referring now to FIG. 4D, a trench isolation structure 112 may be formed in the opening 156 by filling the opening 156 with a suitable dielectric material, for example, by depositing silicon dioxide. In an embodiment, a material removal process may be applied to remove excess material from the top surfaces of the semiconductor layer 102c, drift regions 110' and 120', and the trench isolation structure 112, resulting in a planar top surface where the top surfaces of STIs 126, semiconductor layer 102c, drift regions 110' and 120', and isolation structure 122 are substantially coplanar, allowing for manufacturing tolerances. A mask layer 168 may be formed over the planar top surface where the mask layer 168 includes an opening exposing the top surfaces of the trench isolation structure 112, drift regions 110' and 120', and at least a portion of the semiconductor layer 102c that is adjacent to and in direct contact with the drift regions 110' and 120'. A doping process may be performed with a suitable n-type dopant, for example, arsenic, phosphorus, or any other suitable n-type dopants, to form the resulting drift regions 110 and 120 adjacent to the trench isolation structure 112. In some embodiments, the well 106 may also be formed in base layer 102a at this process stage. In other embodiments, the well 106 may be formed in an earlier stage of the process, for example, before the formation of doped region 108.

Figure 4E:
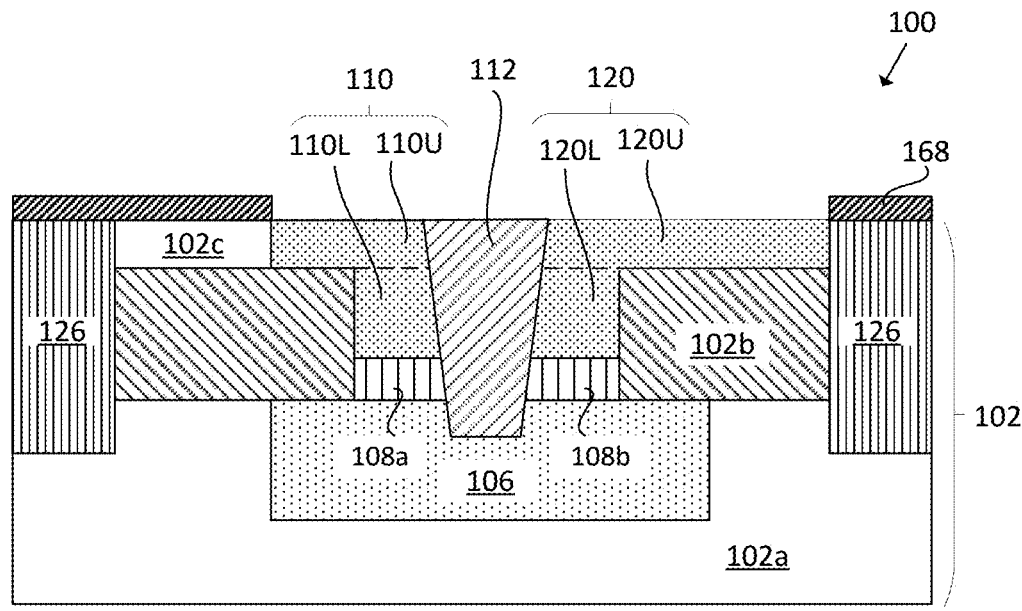

FIG. 4E shows an alternative embodiment where the mask layer 168 has an opening above the drift region 120 that stretches to the STI structure 126, such that the resulting upper portion 120U of the drift region 120 extends to a side surface of the STI structure 126 after the doping process.

Figure 4F:
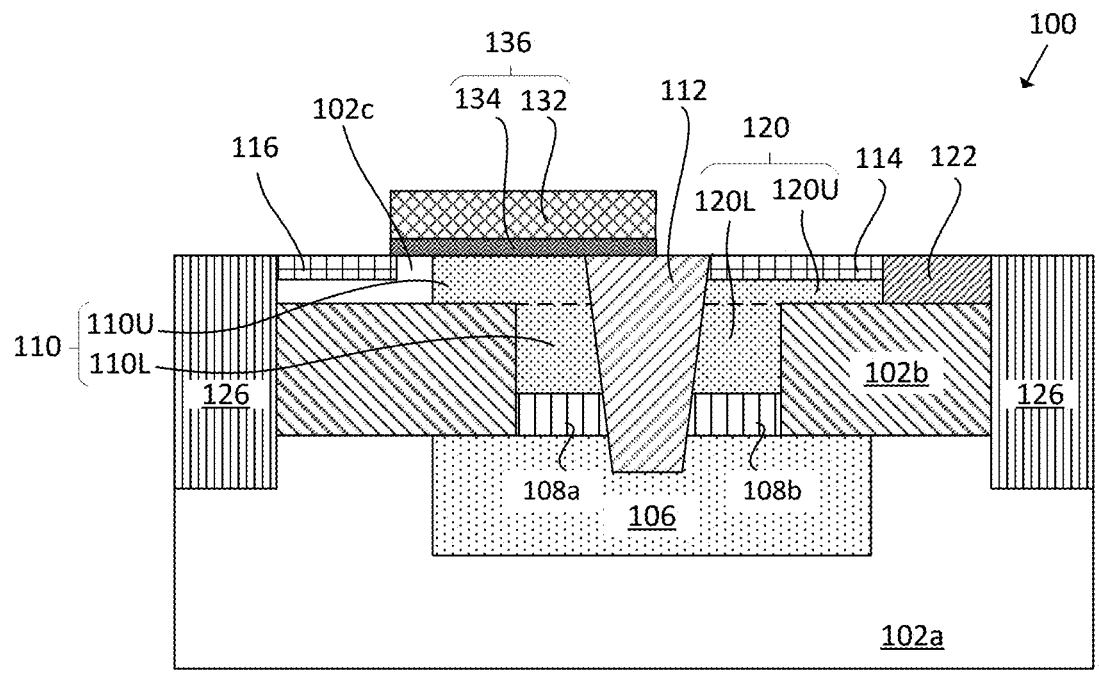

Now referring to FIG. 4F, a gate stack 136 may be formed over the top surfaces of the drift region 110 and the trench isolation structure 112. The gate stack 136 may also partially cover a portion of the semiconductor layer 102c adjacent to the drift region 110. The gate stack 136 including the gate dielectric layer 134 and the gate 132 may be formed by depositing a layer of a suitable dielectric material, for example, silicon dioxide, high dielectric constant material, or any other suitable dielectric material over at least the top surfaces of drift region 110 and the trench isolation structure 112, followed by a layer of a suitable conductive material, for example, polysilicon, titanium nitride, tantalum nitride, or any other suitable conductive material over the dielectric layer. The term "high dielectric constant material" may refer to a dielectric material having a dielectric constant higher than 7. The dielectric layer and the conductive layer may subsequently undergo a suitable patterning process to form the gate stack 136 including the gate 132 and the gate dielectric layer 134. For example, a mask, such as a patterned layer of photoresist, may be formed over the conductive layer, and a material removal process, such as a wet or dry etch process, may be used to remove unwanted portions of the conductive layer and the dielectric layer that are not covered by the mask. In some embodiments, the mask may be removed after the material removal process, leaving the gate stack behind. In other embodiments, the mask may remain over the gate stack 136 during the subsequent doping process. In an embodiment, another mask layer may be formed over the gate stack 136 and other areas of the substrate 102, with mask openings leaving the predetermined areas exposed, for example, the mask may have openings over the intended drain contact region 114 and source contact region 116, leaving them exposed. In other embodiments, the mask layer remaining from the gate stack patterning process may be used as a mask for the doping process. The intended drain contact region 114, which may correspond to the exposed portion of the drift region 120 laterally adjacent to the trench isolation structure 112, and the source contact region 116, which may correspond to the exposed portion of the semiconductor layer 102c laterally adjacent to the gate dielectric layer 134, are then implanted with a suitable n-type dopant, for example, arsenic, phosphorus, or any other suitable n-type dopant. The mask layer may subsequently be removed after the doping process. In some embodiments, for example in FIG. 4D, an isolation structure 122 may also be formed in the substrate 102 prior to the formation of the gate stack 136, by removing a portion of the semiconductor layer 102c between the drift region 120 and the STI structure 126 to form an opening, and then filling the opening with a suitable dielectric material, for example, silicon dioxide. The removal of the portion of the semiconductor layer 102c may include a suitable patterning process, for example etching with a patterned photoresist mask. Subsequently, to obtain a planar or substantially planar top surface where the top surfaces of STI structure 126, semiconductor layer 102c, drift regions 110 and 120, and isolation structure 122 are substantially coplanar or coplanar, a suitable material removal process may be performed prior to the formation of the gate stack 136. A suitable material removal process may be, for example, chemical mechanical planarization or etching process.

Now referring back to FIG. 1A, after the formation of the source and drain contact regions, an insulating layer, for example, the interlayer dielectric (ILD) layer 142 may first be formed over the gate 132, drain contact region 114, source contact region 116, drift regions 110 and 120, trench isolation structure 112, and STI structures 126. Thereafter, openings may be formed in the ILD layer 142 for the forming of contact structures, for example, gate contact 128, drain contact 118 and source contact 138. The ILD layer 142 may be formed by depositing a layer of a suitable dielectric material, for example, silicon dioxide, high density plasma (HDP) undoped silicate glass (USG), tetraethyl orthosilicate (TEOS), or any other suitable dielectric material, followed by a suitable material removal process, for example, chemical mechanical planarization or etching process.

To form the openings for contact structures as aforementioned, a suitable material removal process including the use of a patterned mask may be applied. As an example, a layer of photoresist may be deposited over the ILD layer 142 and patterned to form a suitable patterned mask. A wet etch or dry etch process may be used to remove portions of the insulating layer, as well as portions of the isolation structure 122 and insulator layer 102b which are not covered by the patterned mask, forming openings extending to the top surfaces of the drain contact region 114, source contact region 116, and gate 132. The photoresist pattern may subsequently be removed. To form the LDMOS device 100 shown in FIG. 1A, a layer of a suitable conductive material, for example, copper, tungsten, or any other suitable conductive material may be deposited to fill up the openings to at least the top surface of the insulating layer. The excess conductive material, for example, over the top surface of the insulating layer may subsequently be removed by a suitable material removal process, for example, chemical mechanical planarization or etching process.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A semiconductor device comprising:
  a semiconductor layer over an insulator layer and a base layer under the insulator layer;
  a drain region comprising a well in the base layer, a first doped region above and coupled with the well, a first drift region above and coupled with the first doped region, and a second drift region above the first doped region, wherein the first doped region is at least partially in the insulator layer and the first drift region is at least partially in the semiconductor layer;
  a trench isolation structure within the drain region; and a gate stack partially over the semiconductor layer and overlapping the first drift region, wherein the trench isolation structure partially underlaps the gate stack.

2. The semiconductor device of claim 1, wherein the first drift region comprises an upper portion and a lower portion, the upper portion is in the semiconductor layer and the lower portion is in the insulator layer.

3. The semiconductor device of claim 2, wherein the upper portion of the first drift region comprises a bottom surface in contact with a top surface of the insulator layer.

4. The semiconductor device of claim 1, further comprising a second doped region above the well, wherein the second doped region is coupled with the second drift region.

5. The semiconductor device of claim 1, wherein the trench isolation structure extends into the well.

6. The semiconductor device of claim 1, wherein the trench isolation structure terminates within the first doped region.

7. The semiconductor device of claim 1, wherein the second drift region is coupled with the first doped region.

8. The semiconductor device of claim 1, wherein the trench isolation structure has a depth and the semiconductor layer has a thickness, and the depth of the trench isolation structure is at least the thickness of the semiconductor layer.

9. The semiconductor device of claim 1, wherein the trench isolation structure has a top surface and the first drift region has a top surface, and the top surface of the trench isolation structure is substantially coplanar with the top surface of the first drift region.

10. The semiconductor device of claim 1, wherein the first drift region comprises an upper portion in the semiconductor layer and a lower portion in the insulator layer, and the second drift region is spaced from at least the upper portion of the first drift region by the trench isolation structure.

11. The semiconductor device of claim 1, wherein the first doped region has a higher dopant concentration than the first drift region and the well.

12. A semiconductor device comprising:
a semiconductor layer over an insulator layer and a base layer under the insulator layer;
a drain region comprising a well in the base layer, a first doped region above and coupled with the well, a first drift region above and coupled with the first doped region, and a second drift region above the first doped region, wherein the first doped region is in the insulator layer, and the first drift region is at least partially in the semiconductor layer;
a trench isolation structure within the drain region; and
a gate stack having a first portion over the semiconductor layer, a second portion over the first drift region, and a third portion over the trench isolation structure, wherein the second portion is adjacent to and between the first portion and third portion.

13. The semiconductor device of claim 12, further comprising a drain contact region above and coupled with the second drift region.

14. The semiconductor device of claim 13, wherein the drain contact region has a top surface and the trench isolation structure has a top surface, and the top surface of the drain contact region is substantially coplanar with the top surface of the trench isolation structure.

15. The semiconductor device of claim 13, wherein the first drift region comprises an upper portion and a lower portion, wherein the upper portion is in the insulator layer and the lower portion is in the insulator layer.

16. The semiconductor device of claim 15, wherein the drain contact region is at least spaced from the upper portion of the first drift region by the trench isolation structure.

17. The semiconductor device of claim 12, wherein the second drift region comprises an upper portion and a lower portion, wherein the upper portion is in the insulator layer and the lower portion is in the insulator layer.

18. The semiconductor device of claim 16, wherein the upper portion of the first drift region comprises a bottom surface in contact with a top surface of the insulator layer.

19. The semiconductor device of claim 12, wherein the trench isolation structure has a depth and the semiconductor layer has a thickness, and the depth of the trench isolation structure is at least the thickness of the semiconductor layer.

20. A method of fabricating a semiconductor device, the method comprising:
forming a drain region in a substrate, the substrate comprising a semiconductor layer over an insulator layer and a base layer under the insulator layer, wherein the forming of the drain region further comprises the forming of an opening in the substrate, wherein the opening terminates at the base layer, forming a well in a base layer under the opening, forming a doped region over the well and within the opening, wherein the doped region is at least partially in the insulator layer, and forming a drift region over the doped region, wherein the drift region is at least partially in the semiconductor layer;
forming a trench isolation structure in the drain region; and
forming a gate stack partially over the semiconductor layer, partially over the drift region and partially over the trench isolation structure.

* * * * *